(12) United States Patent  (10) Patent No.: US 8,467,234 B2
Berger et al.  (45) Date of Patent: Jun. 18, 2013

(54) MAGNETIC RANDOM ACCESS MEMORY DEVICES CONFIGURED FOR SELF-REFERENCED READ OPERATION

(75) Inventors: Neal Berger, Cupertino, CA (US); Mourad El Baraji, Sunnyvale, CA (US)

(73) Assignee: Crocus Technology Inc., Santa Clara, CA (US)

( * ) Notice: Subject to any disclaimer, the term of this patent is extended or adjusted under 35 U.S.C. 154(b) by 143 days.

(21) Appl. No.: 13/023,442

(22) Filed: Feb. 8, 2011

(65) Prior Publication Data

US 2012/0201074 A1 Aug. 9, 2012

(51) Int. Cl.
*G11C 11/00* (2006.01)

(52) U.S. Cl.
USPC ........... 365/158; 365/170; 365/171; 365/173; 365/130

(58) Field of Classification Search
USPC .......................... 365/158, 130, 170, 171, 173
See application file for complete search history.

(56) References Cited

U.S. PATENT DOCUMENTS

| | | | | |
|---|---|---|---|---|
| 5,917,749 | A * | 6/1999 | Chen et al. ..................... | 365/173 |
| 5,959,880 | A * | 9/1999 | Shi et al. ........................ | 365/158 |
| 5,982,660 | A * | 11/1999 | Bhattacharyya et al. ..... | 365/173 |
| 6,545,906 | B1 | 4/2003 | Savtchenko et al. | |
| 6,577,529 | B1 * | 6/2003 | Sharma et al. ................ | 365/158 |
| 6,657,889 | B1 * | 12/2003 | Subramanian et al. ....... | 365/158 |
| 6,714,442 | B1 | 3/2004 | Nahas | |
| 6,794,697 | B1 * | 9/2004 | Sharma ......................... | 257/295 |
| 6,937,497 | B1 * | 8/2005 | Ju et al. ......................... | 365/130 |
| 7,133,309 | B2 | 11/2006 | Gaidis et al. | |
| 7,190,611 | B2 * | 3/2007 | Nguyen et al. ................ | 365/158 |
| 7,336,528 | B2 * | 2/2008 | Lim .............................. | 365/171 |
| 7,502,248 | B2 * | 3/2009 | Lim .............................. | 365/158 |
| 7,566,507 | B2 | 7/2009 | Abarra et al. | |
| 7,570,463 | B2 | 8/2009 | Parkin | |
| 7,706,176 | B2 * | 4/2010 | Dittrich ........................ | 365/158 |
| 7,742,333 | B2 * | 6/2010 | Lee et al. ...................... | 365/170 |
| 7,764,454 | B2 * | 7/2010 | Roshchin et al. ............. | 360/59 |
| 7,898,853 | B2 | 3/2011 | Lee et al. | |
| 7,939,816 | B2 | 5/2011 | Lee | |
| 7,952,914 | B2 | 5/2011 | Baek et al. | |
| 8,004,883 | B2 | 8/2011 | Zheng et al. | |

(Continued)

FOREIGN PATENT DOCUMENTS

| | | |
|---|---|---|
| EP | 2355142 A1 | 10/2011 |
| KR | 10-2009-011203 A | 10/2009 |
| WO | 2010/064476 A1 | 6/2010 |

OTHER PUBLICATIONS

International Search Report and Written Opinion, issued to International Patent Application No. PCT/US2012/041562, Aug. 24, 2012, 8 pgs.

(Continued)

*Primary Examiner* — Viet Q Nguyen
(74) *Attorney, Agent, or Firm* — Cooley LLP

(57) ABSTRACT

A magnetic random access memory cell includes a sense layer, a storage layer, and a spacer layer disposed between the sense layer and the storage layer. During a write operation, the storage layer has a magnetization direction that is switchable between m directions to store data corresponding to one of m logic states, with m>2. During a read operation, the sense layer has a magnetization direction that is varied, relative to the magnetization direction of the storage layer, to determine the data stored by the storage layer.

20 Claims, 4 Drawing Sheets

U.S. PATENT DOCUMENTS

| | | | |
|---|---|---|---|
| 8,018,011 | B2 | 9/2011 | Ranjan et al. |
| 8,058,696 | B2 | 11/2011 | Ranjan et al. |
| 8,081,501 | B2 | 12/2011 | Choi et al. |
| 2006/0028774 | A1 | 2/2006 | Katti |
| 2008/0180989 | A1 | 7/2008 | Baek et al. |
| 2008/0247072 | A1 | 10/2008 | Nozieres |
| 2009/0027948 | A1* | 1/2009 | Ruehrig ......................... 365/158 |
| 2009/0073755 | A1 | 3/2009 | Katti |
| 2011/0002151 | A1 | 1/2011 | Javerliac et al. |
| 2012/0120718 | A1* | 5/2012 | Lou et al. ...................... 365/158 |
| 2012/0155164 | A1* | 6/2012 | Shukh ........................... 365/171 |
| 2012/0201073 | A1* | 8/2012 | Berger et al. ................. 365/158 |
| 2012/0314487 | A1 | 12/2012 | El Baraji et al. |
| 2012/0314488 | A1 | 12/2012 | El Baraji et al. |

OTHER PUBLICATIONS

Nonfinal Office Action, issued to U.S. Appl. No. 13/158,316, Nov. 8, 2012, 7 pgs.

Bland, "Shape Anisotropy", Mar. 15, 2003, retrieved on Jul. 29, 2012 from the Internet: <URL: http://www.cmp.liv.ac.uk/frink/thesis/thesis/node67.html>, 4 pgs.

"International Search Report and Written Opinion" issued to International Patent Application No. PCT/US2012/041556, Aug. 16, 2012, 9 pgs.

Sebastian et al., "All Optical Investigation of the Shape Anisotropy of Individual Micron Sized Ni80Fe20 Elements", AG Magnetismus Tu Kaiserslautern, 2010, retrieved on Jul. 29, 2012 from the Internet: <URL: http://www.physik.uni-kl.de/fileadmin/hillebrands/Jahresberichte/Annual_report_2010/AR2010-Chapter4-19.pdf>, pp. 124-128.

"International Search Report and Written Opinion" issued to International Patent Application No. PCT/US2012/023682, Aug. 29, 2012, 8 pgs.

* cited by examiner

MAGNETIC RANDOM ACCESS MEMORY DEVICES CONFIGURED FOR SELF-REFERENCED READ OPERATION

FIELD OF THE INVENTION

The invention relates generally to magnetic random access memory ("MRAM") devices. More particularly, the invention relates to MRAM devices configured for self-referenced read operation.

BACKGROUND

MRAM devices have become the subject of increasing interest, in view of the discovery of magnetic tunnel junctions having a strong magnetoresistance at ambient temperatures. MRAM devices offer a number of benefits, such as faster speed of writing and reading, non-volatility, and insensitivity to ionizing radiations. Consequently, MRAM devices are increasingly replacing memory devices that are based on a charge state of a capacitor, such as dynamic random access memory devices and flash memory devices.

In a conventional implementation, a MRAM device includes an array of MRAM cells, each of which includes a magnetic tunnel junction formed of a pair of ferromagnetic layers separated by a thin insulating layer. One ferromagnetic layer, the so-called reference layer, is characterized by a magnetization with a fixed direction, and the other ferromagnetic layer, the so-called storage layer, is characterized by a magnetization with a direction that is varied upon writing of the device, such as by applying a magnetic field. When the respective magnetizations of the reference layer and the storage layer are antiparallel, a resistance of the magnetic tunnel junction is high, namely having a resistance value $R_{max}$ corresponding to a high logic state "1". On the other hand, when the respective magnetizations are parallel, the resistance of the magnetic tunnel junction is low, namely having a resistance value $R_{min}$ corresponding to a low logic state "0". A logic state of a MRAM cell is read by comparing its resistance value to a reference resistance value $R_{ref}$, which is derived from a reference cell or a group of reference cells and represents an in-between resistance value between that of the high logic state "1" and the low logic state "0".

In a conventional MRAM cell, a reference layer is typically exchange biased by an adjacent antiferromagnetic layer, which is characterized by a threshold temperature $T_{BR}$ of the antiferromagnetic layer. Below the threshold temperature $T_{BR}$, a magnetization of the reference layer is pinned by the exchange bias of the antiferromagnetic layer, thereby retaining the magnetization of the reference layer in a fixed direction. Above the threshold temperature $T_{BR}$, the exchange bias substantially vanishes, thereby unpinning the magnetization of the reference layer. Consequently, and in order to avoid data loss, an operation temperature window of the conventional MRAM cell has an upper bound defined by the threshold temperature $T_{BR}$.

In the case of a MRAM cell that is implemented for thermally assisted switching ("TAS"), a storage layer also is typically exchange biased by another antiferromagnetic layer, which is adjacent to the storage layer and is characterized by a threshold temperature $T_{BS}$ that is smaller than the threshold temperature $T_{BR}$. Below the threshold temperature $T_{BS}$, a magnetization of the storage layer is pinned by the exchange bias, thereby inhibiting writing of the storage layer. Writing is carried out by heating the MRAM cell above the threshold temperature $T_{BS}$ (but below $T_{BR}$), thereby unpinning the magnetization of the storage layer to allow writing, such as by applying a magnetic field. The MRAM cell is then cooled to below the threshold temperature $T_{BS}$ with the magnetic field applied, such that the magnetization of the storage layer is "frozen" in the written direction.

While offering a number of benefits, a conventional TAS-type MRAM device suffers from certain deficiencies. Specifically, a write operation temperature window is defined by $T_{BR}-T_{BS}$ and, therefore, is bounded by the threshold temperature $T_{BR}$ at the upper end and the threshold temperature $T_{BS}$ at the lower end. Because of practical constraints on antiferromagnetic materials for exchange bias, the write operation temperature window can be rather limited, such as to a range less than 200° C. or less than 150° C. Moreover, in the case of an array of TAS-type MRAM cells, characteristics of individual cells can vary across the array due to manufacturing variability. This variability can result in a distribution of the threshold temperatures $T_{BS}$ and $T_{BR}$ for the array, which, for example, can amount up to ±30° C., thereby further reducing the write operation temperature window. In addition, this variability can impact a resistance of magnetic tunnel junctions across the array and can result in a distribution of the resistance values $R_{min}$ and $R_{max}$ for the array, thereby complicating a comparison between a measured resistance value of an individual cell and a reference resistance value $R_{ref}$ during reading. Consequently, a tight tolerance control can be required during manufacturing, and this tight tolerance control can translate into lower manufacturing yields and higher manufacturing costs.

The limited operation temperature window of a conventional TAS-type MRAM device presents additional challenges. For example, in the case of certain applications, such as space, military, and automotive applications, an ambient temperature in the vicinity of the MRAM device can be rather high. A high local temperature also can result from current-induced heat transfer in the MRAM device itself or in an adjacent device. In order to pin a magnetization of a storage layer between write operations, the threshold temperature $T_{BS}$ can be set higher than the local temperature. However, a higher threshold temperature $T_{BS}$ has the undesirable effect of further reducing the operation temperature window of the MRAM device, thereby limiting its use for such high temperature applications.

Also, a high ambient temperature can result in a local temperature during writing that exceeds the threshold temperature $T_{BR}$, thereby unpinning a magnetization of a reference layer and yielding data loss. In order to avoid such data loss, a temperature controller can be included to compensate for local temperature variations. However, the inclusion of such temperature controller can add to the complexity of a MRAM device and can translate into higher manufacturing costs. Furthermore, and in the case of TAS, a speed of writing can depend upon a speed at which a cell within the MRAM device is heated. Specifically, a greater amount of power applied through the cell can translate into a faster speed of heating and, therefore, a faster speed of writing. However, in a conventional TAS-type MRAM cell, the speed of writing can be constrained, since the application of high power through the cell can result in a temperature overshoot above the threshold temperature $T_{BR}$, thereby yielding data loss.

It is against this background that a need arose to develop the MRAM devices and related methods described herein.

SUMMARY

One aspect of the invention relates to a memory device. In one embodiment, the memory device includes at least one MRAM cell, which includes a sense layer, a storage layer, and a spacer layer disposed between the sense layer and the storage layer. During a write operation, the storage layer has a magnetization direction that is switchable between m directions to store data corresponding to one of m logic states, with m>2. During a read operation, the sense layer has a magnetization direction that is varied, relative to the magnetization direction of the storage layer, to determine the data stored by the storage layer.

Another aspect of the invention relates to a method of operating a MRAM cell. In one embodiment, the method includes, during a write operation, switching a storage magnetization direction of the MRAM cell from an initial logic state to one of multiple other logic states to store a multi-bit data value. The method also includes, during a read operation, varying a sense magnetization direction of the MRAM cell, relative to the storage magnetization direction, to determine the stored multi-bit data value.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings. In the drawings, like reference numbers denote like features, unless the context clearly dictates otherwise.

DETAILED DESCRIPTION

Definitions

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to an object can include multiple objects unless the context clearly dictates otherwise.

As used herein, the term "set" refers to a collection of one or more objects. Thus, for example, a set of objects can include a single object or multiple objects. Objects of a set also can be referred to as members of the set. Objects of a set can be the same or different. In some instances, objects of a set can share one or more common characteristics.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical manufacturing tolerances or variability of the embodiments described herein.

As used herein, the term "adjacent" refers to being near or adjoining Adjacent objects can be spaced apart from one another or can be in actual or direct contact with one another. In some instances, adjacent objects can be coupled to one another or can be formed integrally with one another.

As used herein, the terms "couple," "coupled," and "coupling" refer to an operational connection or linking. Coupled objects can be directly connected to one another or can be indirectly connected to one another, such as via another set of objects.

As used herein, the term "main group element" refers to a chemical element in any of Group IA (or Group 1), Group IIA (or Group 2), Group IIIA (or Group 13), Group WA (or Group 14), Group VA (or Group 15), Group VIA (or Group 16), Group VIIA (or Group 17), and Group VIIIA (or Group 18). A main group element is also sometimes referred to as a s-block element or a p-block element.

As used herein, the term "transition metal" refers to a chemical element in any of Group WB (or Group 4), Group VB (or Group 5), Group VIB (or Group 6), Group VIIB (or Group 7), Group VIIIB (or Groups 8, 9, and 10), Group IB (or Group 11), and Group IIB (or Group 12). A transition metal is also sometimes referred to as a d-block element.

As used herein, the term "rare earth element" refers to any of Sc, Y, La, Ce, Pr, Nd, Pm, Sm, Eu, Gd, Tb, Dy, Ho, Er, Tm, Yb, and Lu.

MRAM Devices

Figure 1:
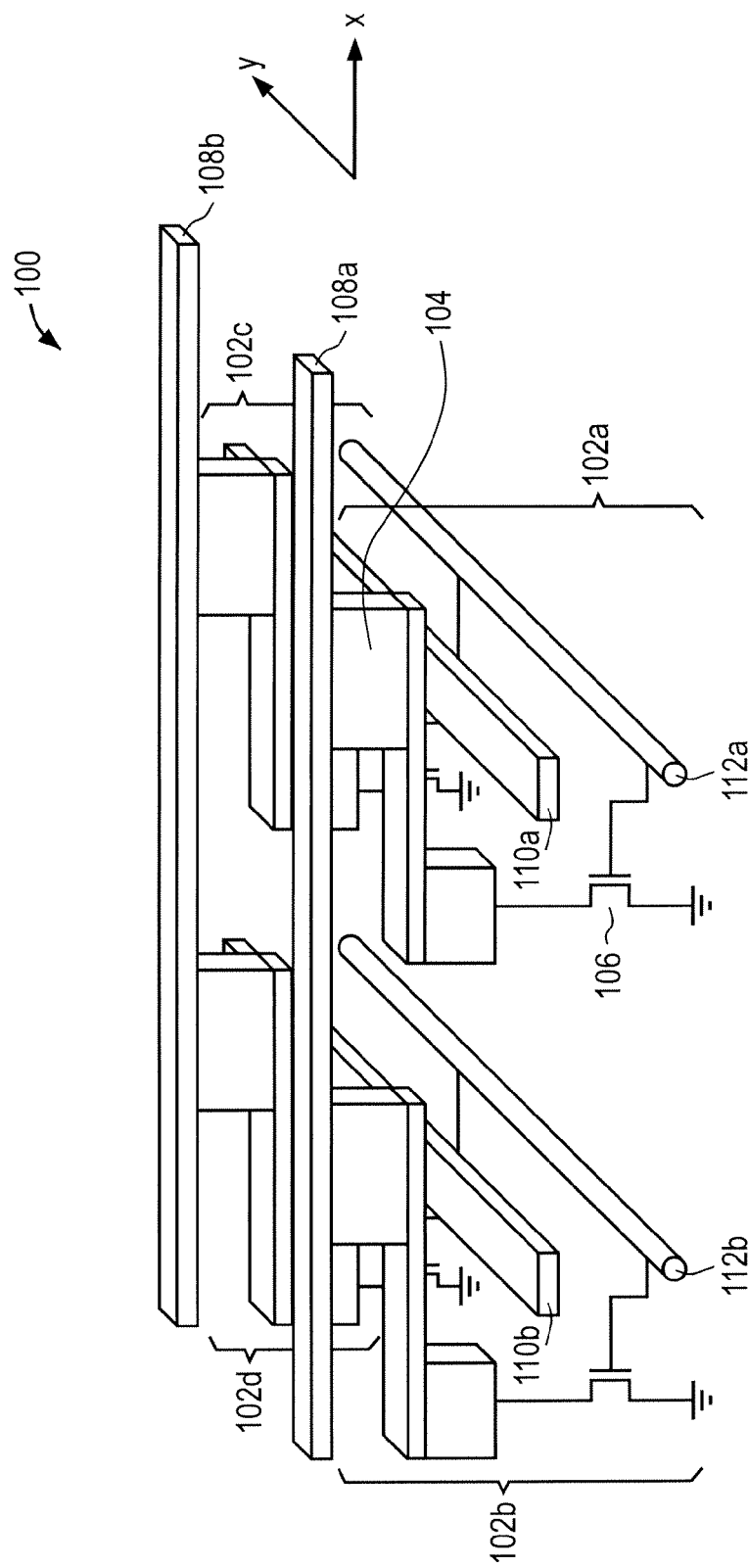
FIG. 1 illustrates a MRAM device implemented in accordance with an embodiment of the invention.

Attention first turns to FIG. 1, which is a perspective view of a memory device implemented in accordance with an embodiment of the invention. In the illustrated embodiment, the memory device is a MRAM device 100 that includes a set of MRAM cells 102a, 102b, 102c, and 102d. Each of the MRAM cells 102a, 102b, 102c, and 102d includes a magnetic tunnel junction and a selection transistor, such as a magnetic tunnel junction 104 and a selection transistor 106 included in the MRAM cell 102a. Referring to FIG. 1, the MRAM cells 102a, 102b, 102c, and 102d are arranged in rows and columns along substantially orthogonal directions of a square or rectangular array, although other two-dimensional and three-dimensional arrays are contemplated. Also, while the four MRAM cells 102a, 102b, 102c, and 102d are illustrated in FIG. 1, it is contemplated that more or less MRAM cells can be included in the MRAM device 100.

In the illustrated embodiment, the MRAM cells 102a, 102b, 102c, and 102d are implemented for self-referenced operations, in which a read operation can be carried out based on a relative alignment of magnetizations within a particular cell being read and without requiring a comparison to an external resistance value of a reference cell or a group of reference cells. As further explained below, the self-referenced implementation of the MRAM cells 102a, 102b, 102c, and 102d allows the omission of a reference layer with a fixed magnetization and, therefore, allows the operation of the MRAM cells 102a, 102b, 102c, and 102d in the absence of, or without regard to, the threshold temperature $T_{BR}$. In such manner, an operation temperature window of the MRAM device 100 can be greatly expanded, such as to allow operation under high ambient temperatures and to allow a faster speed of writing. Moreover, the MRAM device 100 can be afforded with a greater insensitivity to manufacturing variability, thereby increasing manufacturing yields and lowering manufacturing costs.

Referring to FIG. 1, the MRAM device 100 includes a set of traces or strip conductors to provide write and read functionality. Specifically, a set of field lines 110a and 110b extend across the array of the MRAM cells 102a, 102b, 102c, and 102d in a substantially parallel fashion with respect to one another, with the field line 110a magnetically coupled to the MRAM cells 102a and 102c along one column of the array, and with the field line 110b magnetically coupled to the MRAM cells 102b and 102d along another column of the array. During write operations, the application of currents through the field lines 110a and 110b induces magnetic fields that can vary one set of magnetizations of the MRAM cells 102a, 102b, 102c, and 102d, namely storage magnetizations of respective ones of the MRAM cells 102a, 102b, 102c, and 102d. During read operations, the application of currents through the field lines 110a and 110b induces magnetic fields that can vary another set of magnetizations of the MRAM cells 102a, 102b, 102c, and 102d, namely sense magnetizations of respective ones of the MRAM cells 102a, 102b, 102c, and 102d.

The MRAM device 100 also includes a set of bit lines 108a and 108b, which extend across the array in a substantially parallel fashion with respect to one another and in a substantially orthogonal fashion with respect to the field lines 110a and 110b. Specifically, the bit line 108a is electrically coupled to the MRAM cells 102a and 102b along one row of the array, and the bit line 108b is electrically coupled to the MRAM cells 102c and 102d along another row of the array. In the illustrated embodiment, the MRAM cells 102a, 102b, 102c, and 102d are implemented for TAS, and, during write operations, the application of currents through the bit lines 108a and 108b and through the MRAM cells 102a, 102b, 102c, and 102d results in heating that allows the storage magnetizations of the MRAM cells 102a, 102b, 102c, and 102d to be varied. During read operations, the application of currents through the bit lines 108a and 108b and through the MRAM cells 102a, 102b, 102c, and 102d allows the determination of resistance values, which are indicative of a degree of alignment between the sense magnetizations and the storage magnetizations of the MRAM cells 102a, 102b, 102c, and 102d. As illustrated in FIG. 1, the application of currents through the bit lines 108a and 108b also induces magnetic fields, which can vary the magnetizations of the MRAM cells 102a, 102b, 102c, and 102d during write and read operations. In other words, the bit lines 108a and 108b also function as a set of field lines. The implementation of such dual-function bit lines 108a and 108b conserves valuable die area and lowers manufacturing costs. Also, because of the close spacing of the bit lines 108a and 108b relative to the MRAM cells 102a, 102b, 102c, and 102d, switching efficiency of induced magnetic fields can be improved, thereby allowing low-intensity magnetic fields and reduced power consumption.

Still referring to FIG. 1, the MRAM device 100 further includes a set of control lines 112a and 112b, which are electrically coupled to the MRAM cells 102a, 102b, 102c, and 102d through their selection transistors. Specifically, the control line 112a is electrically coupled to the selection transistors of the MRAM cells 102a and 102c along one column of the array, and the control line 112b is electrically coupled to the selection transistors of the MRAM cells 102b and 102d along another column of the array. During write and read operations, the control lines 112a and 112b switch the selection transistors between a blocked mode (OFF) and a saturated mode (ON). Coordinated operation of the field lines 110a and 110b, the bit lines 108a and 108b, and the control lines 112a or 112b allows a particular subset of the MRAM cells 102a, 102b, 102c, and 102d to be selectively addressed during write and read operations. For example, when the MRAM cell 102a is to be written or read, the field line 110a and the bit line 108a can be activated, and the control line 112a also can be activated to switch the selection transistor 106 to a saturated mode, thereby inducing a magnetic field in the vicinity of the MRAM cell 102a and allowing the flow of a current through the MRAM cell 102a. In such manner, the MRAM cell 102a, which is disposed at an intersection of the field line 110a, the bit line 108a, and the control line 112a, can be individually addressed.

Other implementations of the field lines 110a and 110b, the bit lines 108a and 108b, and the control lines 112a or 112b are contemplated. Specifically, the orientation and the number of these traces can be varied from that illustrated in FIG. 1. For example, the field lines 110a and 110b can be combined into a common field line that is magnetically coupled to, and shared by, the MRAM cells 102a and 102c and the MRAM cells 102b and 102d in different columns. As another example, the field lines 110a and 110b can be disposed above the bit lines 108a and 108b, rather than below the bit lines 108a and 108b as illustrated in FIG. 1. As a further example, and as explained below with reference to FIG. 4, a set of field lines can be included above the bit lines 108a and 108b, in addition to the field lines 110a and 110b.

Figure 2:
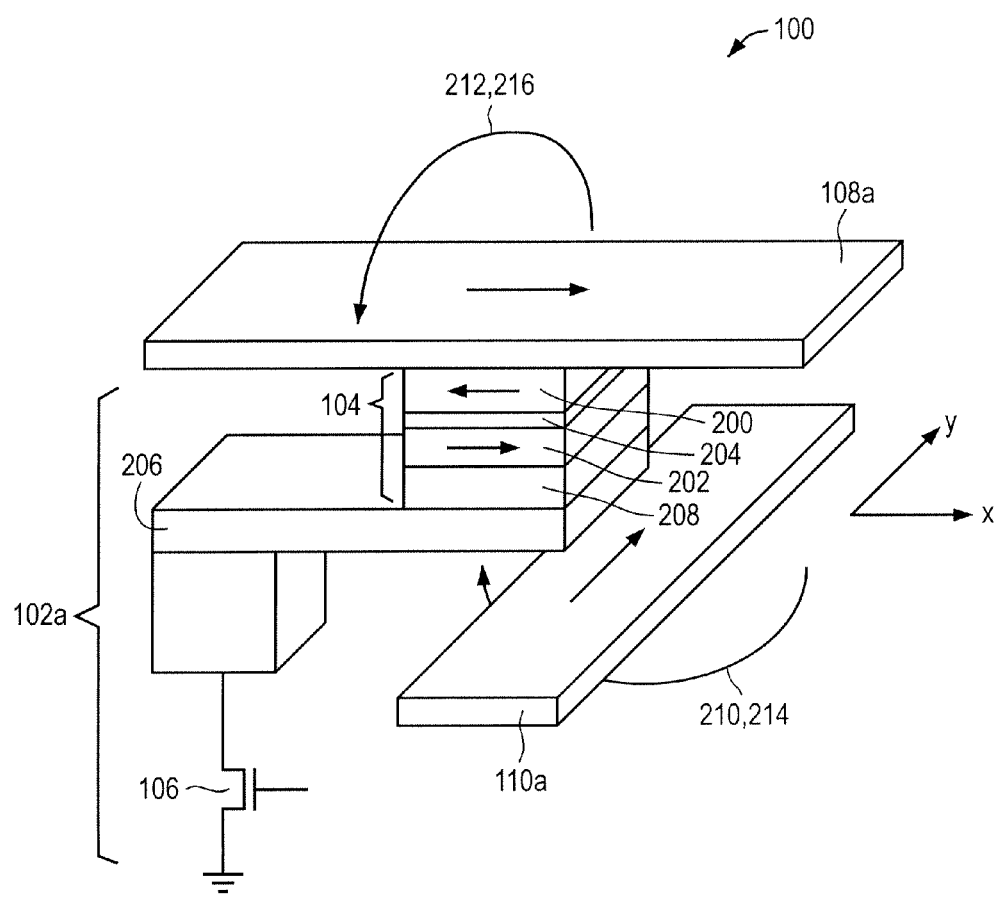
FIG. 2 illustrates a MRAM cell included in the MRAM device of FIG. 1, according to an embodiment of the invention.

Attention next turns to FIG. 2, which is an enlarged view of the MRAM cell 102a that is included in the MRAM device 100 of FIG. 1, according to an embodiment of the invention. The MRAM cell 102a includes the magnetic tunnel junction 104, which includes a sense layer 200, a storage layer 202, and a spacer layer 204 that is disposed between the sense layer 200 and the storage layer 202. As illustrated in FIG. 2, the bit line 108a is electrically coupled to the magnetic tunnel junction 104 on the side of the sense layer 200 and is substantially orthogonal to the field line 110a, which is disposed below and magnetically coupled to the magnetic tunnel junction 104 on the side of the storage layer 202. The MRAM cell 102a also includes the selection transistor 106, which is electrically coupled, through a strap 206, to the magnetic tunnel junction 104 on the side of the storage layer 202. Other implementations of the MRAM cell 102a are contemplated. For example, the relative positioning of the sense layer 200 and the storage layer 202 can be reversed in the magnetic tunnel junction 104, with the storage layer 202 disposed above the sense layer 200.

Each of the sense layer 200 and the storage layer 202 includes, or is formed of, a magnetic material and, in particular, a magnetic material of the ferromagnetic type. A ferromagnetic material can be characterized by a substantially planar magnetization with a particular coercivity, which is indicative of a magnitude of a magnetic field to reverse the magnetization after it is driven to saturation in one direction. In general, the sense layer 200 and the storage layer 202 can include the same ferromagnetic material or different ferromagnetic materials. As illustrated in FIG. 2, the sense layer 200 includes a soft ferromagnetic material, namely one having a relatively low coercivity, such as no greater than about 0.01 oersted, while the storage layer 202 includes a hard ferromagnetic material, namely one having a relatively high coercivity, such as greater than about 0.01 oersted. In such manner, a magnetization of the sense layer 200 can be readily varied under low-intensity magnetic fields during read operations, while a magnetization of the storage layer 202 remains stable. Suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or $Ni_{80}Fe_{20}$); alloys based on Ni, Fe, and boron ("B"); $Co_{90}Fe_{10}$; and alloys based on Co, Fe, and B. In some instances, alloys based on Ni and Fe (and optionally B) can have a smaller coercivity than alloys based on Co and Fe (and optionally B). A thickness of each of the sense layer 200 and the storage layer 202 can be in the nanometer ("nm") range, such as from about 1 nm to about 20 nm or from about 1 nm to about 10 nm. Other implementations of the sense layer 200 and the storage layer 202 are contemplated. For example, either, or both, of the sense layer 200 and the storage layer 202 can include multiple sub-layers in a fashion similar to that of the so-called synthetic antiferromagnetic layer.

The spacer layer 204 functions as a tunnel barrier and includes, or is formed of, an insulating material. Suitable insulating materials include oxides, such as aluminum oxide (e.g., $Al_2O_3$) and magnesium oxide (e.g., MgO). A thickness of the spacer layer 204 can be in the nm range, such as from about 1 nm to about 10 nm.

In the illustrated embodiment, the MRAM cell 102a is implemented to store data corresponding to any of three or more logic states. In other words, the MRAM cell 102a is a multi-bit cell that stores a multi-bit data value. Other MRAM cells included in the MRAM device 100, such as the MRAM cells 102b, 102c, and 102d illustrated in FIG. 1, also can be implemented as multi-bit cells. The implementation of such multi-bit cells enhances a storage density of the MRAM device 100, relative to an implementation with single-bit or binary cells.

In accordance with the multi-bit implementation of the MRAM cell 102a, the storage layer 202 has a storage magnetization direction that is switchable between m directions corresponding to m logic states, with m>2. Referring to FIG. 2, the magnetic tunnel junction 104 also includes a pinning layer 208, which is disposed adjacent to the storage layer 202 and, through exchange bias, stabilizes the storage magnetization direction along a particular one of the m directions when a temperature within, or in the vicinity of, the pinning layer 208 is lower than a threshold temperature $T_{BS}$, such as a blocking temperature, a Neel temperature, or another threshold temperature. The pinning layer 208 unpins, or decouples, the storage magnetization direction when the temperature is above the threshold temperature $T_{BS}$, thereby allowing the storage magnetization direction to be switched to another one of the m directions. In contrast, such a pinning layer is omitted adjacent to the sense layer 200, and, as a result, the sense layer 200 has a sense magnetization direction that is unpinned and is readily varied, with the substantial absence of exchange bias. The pinning layer 208 includes, or is formed of, a magnetic material and, in particular, a magnetic material of the antiferromagnetic type. Suitable antiferromagnetic materials include transition metals and their alloys. For example, suitable antiferromagnetic materials include alloys based on manganese ("Mn"), such as alloys based on iridium ("Ir") and Mn (e.g., IrMn); alloys based on Fe and Mn (e.g., FeMn); alloys based on platinum ("Pt") and Mn (e.g., PtMn); and alloys based on Ni and Mn (e.g., NiMn). In some instances, the threshold temperature $T_{BS}$ of alloys based on Ir and Mn (or based on Fe and Mn) can be in the range of about 120° C. to about 220° C. or about 150° C. to about 200° C., and can be smaller than the threshold temperature $T_{BS}$ of alloys based on Pt and Mn (or based on Ni and Mn), which can be in the range of about 300° C. to about 350° C. Because the sense magnetization direction is unpinned, the threshold temperature $T_{BS}$ can be selected to accommodate a desired application, such as a high temperature application, in the absence of, or without regard to, a threshold temperature $T_{BR}$ that would otherwise set an upper bound of an operating temperature window.

During a TAS-type write operation of the MRAM cell 102a, the magnetic tunnel junction 104 is heated by applying a heating current through the magnetic tunnel junction 104 via the bit line 108a, with the selection transistor 106 in a saturated mode. The magnetic tunnel junction 104 is heated to a temperature above the threshold temperature $T_{BS}$ of the pinning layer 208, such that a magnetization of the storage layer 202 is unpinned. Simultaneously or after a short time delay, at least one of the field line 110a and the bit line 108a (functioning as another field line) is activated to induce a set of write magnetic fields to switch the storage magnetization direction from an initial one of m directions to another one of the m directions. Specifically, a write current can be applied through the field line 110a to induce a write magnetic field 210 to switch the storage magnetization direction accordingly. Alternatively, or in combination, a write current can be applied through the bit line 108a to induce a write magnetic field 212 to switch the storage magnetization direction accordingly.

Figure 3:
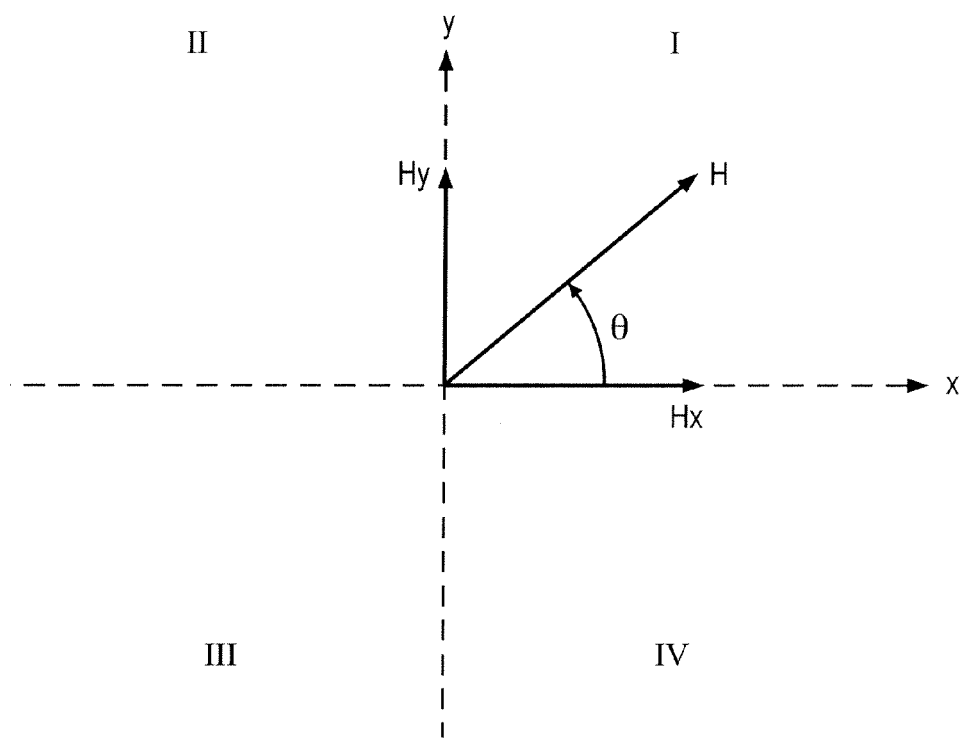
FIG. 3 illustrates a set of magnetic fields that are induced during write and read operations of the MRAM cell of FIG. 2, according to an embodiment of the invention.

The write operation of the MRAM cell 102a can be further understood with reference to FIG. 3, which illustrates the write magnetic fields 210 and 212 projected along a plane (here, an x-y plane) in which the storage magnetization direction is switchable. Specifically, $H_x$ represents the x-component of the write magnetic field 210 when projected along the plane, and $H_y$ represents the y-component of the write magnetic field 212 when projected along the plane. By combining $H_x$ and $H_y$, a resultant write magnetic field, which is represented as H, is generated with an orientation at an angle θ relative to the positive x-axis, where θ=arctangent $(H_y/H_x)$ when H lies in quadrant I, θ=180°+arctangent $(H_y/H_x)$ when H lies in quadrant II or III, and θ=360°+arctangent $(H_y/H_x)$ when H lies in quadrant IV. By varying the signs and magnitudes of $H_x$ and $H_y$, namely by varying the directions and magnitudes of the write currents through the field line 110a and the bit line 108a, distinct values of θ are obtained in the range of 0° to 360°. Because the storage magnetization direction can be aligned according to θ, m logic states can be encoded, with each logic state assigned to a distinct value of θ.

For certain implementations, m is represented as $m=2^n$, with $n \geq 2$. Here, the MRAM cell 102a is an n-bit cell that stores an n-bit data value. One possible write encoding scheme assigning m logic states to m distinct values of θ is set forth in Table 1 below. In the case that m=4 and n=2, one possible write encoding scheme assigning four logic states to four distinct values of θ is set forth in Table 2 below. It should be understood that other write encoding schemes are contemplated. For example, the assignment between m logic states and m distinct values of θ can be permuted, such that the logic state "00" is assigned to 90° (instead of 0°), the logic state "01" is assigned to 0° (instead of 90°), and so forth. As another example, an offset can be added to some, or all, of the values of θ, such that the logic state "00" is assigned to 0°+offset, the logic state "01" is assigned to 90°+offset, and so forth. As further examples, an increment between successive values of θ can be variable, rather than a constant, and certain of the m logic states and certain of the m distinct values of θ can be omitted.

TABLE 1

| Logic State/<br>n-bit data | θ |
|---|---|
| 0 . . . 00 | 0° |
| 0 . . . 01 | $360°/2^n$ |

TABLE 1-continued

| Logic State/<br>n-bit data | θ |
|---|---|
| 0 ... 10 | $2(360°/2^n)$ |
| 0 ... 11 | $3(360°/2^n)$ |
| ... | ... |

TABLE 2

| Logic State/<br>2-bit data | θ |
|---|---|
| 00 | 0° |
| 01 | 90° |
| 10 | 180° |
| 11 | 270° |

Referring back to FIG. 2, once the storage magnetization direction is switched to a written direction, the selection transistor 106 is switched to a blocked mode to inhibit current flow through the magnetic tunnel junction 104, thereby cooling the magnetic tunnel junction 104. Either, or both, of the write magnetic fields 210 and 212 can be maintained during cooling of the magnetic tunnel junction 104, and can be deactivated once the magnetic tunnel junction 104 has cooled below the threshold temperature $T_{BS}$ of the pinning layer 208. Because the storage magnetization direction is pinned by the exchange bias of the pinning layer 208, its orientation remains stable so as to retain the written data.

Other implementations of write operations are contemplated. For example, the magnetic tunnel junction 104 can be implemented with an anisotropic shape having a relatively high aspect ratio, such as about 1.5 or more. In such an anisotropic-shaped implementation of the magnetic tunnel junction 104, the storage magnetization direction can be switched and can remain stable, without requiring the pinning layer 208. As another example, a write operation of the MRAM cell 102a can be carried out by applying a write current through the magnetic tunnel junction 104 via the bit line 108a, using the so-called spin transfer torque ("STT") effect. In such a STT-type write operation, the write current can become spin polarized by passing through a polarizing magnetic layer (not illustrated) or through the sense layer 200, and a magnetization of the storage layer 202 can be switched according to a spin-polarized orientation of the write current. Switching of the storage layer magnetization with the spin-polarized write current also can be combined with a TAS-type write operation, such as by heating the magnetic tunnel junction 104 above the threshold temperature $T_{BS}$ and then applying the spin-polarized write current through the magnetic tunnel junction 104.

During a read operation of the MRAM cell 102a, at least one of the field line 110a and the bit line 108a (functioning as another field line) is activated to induce a set of read magnetic fields to vary a magnetization of the sense layer 200. Specifically, a read current can be applied through the field line 110a to induce a read magnetic field 214 to vary the sense magnetization direction accordingly. Alternatively, or in combination, a read current can be applied through the bit line 108a to induce a read magnetic field 216 to vary the sense magnetization direction accordingly. Because the sense layer 200 is subject to little or no exchange bias, the sense magnetization direction can be readily varied under low-intensity magnetic fields and at a temperature below the threshold temperature $T_{BS}$, while the storage magnetization direction remains stable in a written direction.

For certain implementations, the read operation of the MRAM cell 102a is carried out in multiple read cycles, in which the field line 110a and the bit line 108a (functioning as another field line) are activated to induce a set of resultant read magnetic fields compatible with a write encoding scheme. Because the sense magnetization direction can be aligned according to the resultant read magnetic fields, the sense magnetization direction can be successively switched between m directions according to the write encoding scheme. For example, referring to FIG. 2 and Table 1 above, a first read cycle can generate a resultant read magnetic field at an angle θ=0°, a second read cycle can generate a resultant read magnetic field at an angle $θ=360°/2^n$, a third read cycle can generate a resultant read magnetic field at an angle θ=2 $(360°/2^n)$, and so forth. In such manner, the sense magnetization direction is rotated to m distinct values of θ according to the write encoding scheme.

As part of each read cycle, a degree of alignment between the sense magnetization direction and the storage magnetization direction is determined by applying a sense current though the magnetic tunnel junction 104 via the bit line 108a, with the selection transistor 106 in a saturated mode. Measuring a resulting voltage across the magnetic tunnel junction 104 when the sense current is applied yields a resistance value of the magnetic tunnel junction 104 for a particular read cycle and for a particular value of θ. Alternatively, a resistance value can be determined by applying a voltage across the magnetic tunnel junction 104 and measuring a resulting current. When the respective magnetizations of the sense layer 200 and the storage layer 202 are antiparallel, a resistance value of the magnetic tunnel junction 104 typically corresponds to a maximum value, namely $R_{max}$, and, when the respective magnetizations are parallel, a resistance value of the magnetic tunnel junction 104 typically corresponds to a minimum value, namely $R_{min}$. When the respective magnetizations are between antiparallel and parallel, a resistance value of the magnetic tunnel junction 104 is typically between $R_{max}$ and $R_{min}$. Resistance values for multiple read cycles are processed to determine which value of θ yielded a minimum resistance value, thereby yielding a stored multi-bit data value based on which of m logic states is assigned to that value of θ. Processing of the resistance values can be carried out using a suitable controller in combination with, for example, a sample/hold circuit.

The read operation of the MRAM cell 102a explained above is self-referenced, since it can be carried out based on the relative alignment of magnetizations within the MRAM cell 102a, without requiring a comparison to a reference cell or a group of reference cells. The self-referenced read implementation of the MRAM cell 102a is particularly desirable when reading multi-bit data, which otherwise would involve a comparison to multiple reference resistance values and would be prone to errors in view of manufacturing variability. The self-referenced implementation of the MRAM cell 102a also allows the omission of a reference layer with a fixed magnetization and, therefore, allows the operation of the MRAM cell 102a in the absence of, or without regard to, a threshold temperature $T_{BR}$. In such manner, an operation temperature window of the MRAM cell 102a can be greatly expanded, such as to temperatures up to about 400° C. or more. Moreover, and in view of the expanded operation temperature window, a high-intensity heating current can be applied during writing, such as in the form of a pulse having a duration of less than about 10 nanoseconds, thereby allowing a faster speed of writing.

Other implementations of self-referenced read operations are contemplated. For example, a faster speed of reading can be achieved by skipping certain of m logic states, with a resistance value corresponding to a skipped logic state determined by interpolation from adjacent logic states. A faster speed of reading also can be achieved by skipping certain of m logic states and using a suitable search technique to locate a minimum resistance value, such as by leveraging symmetries, incremental changes, or curvature related to resistance values of a subset of the m logic states.

Figure 4:
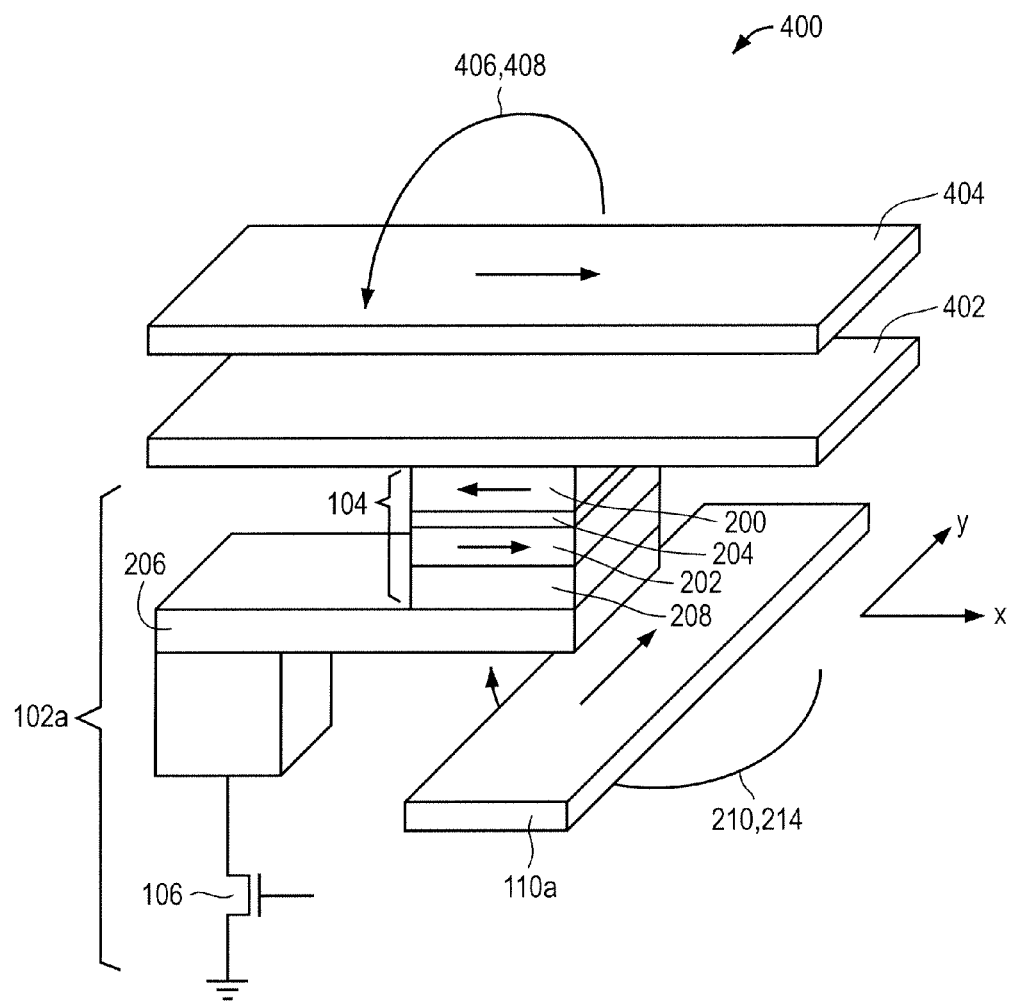
FIG. 4 illustrates a MRAM device implemented in accordance with another embodiment of the invention.

FIG. 4 illustrates a MRAM device 400 implemented in accordance with another embodiment of the invention. Certain aspects of the MRAM device 400 are implemented in a similar fashion as the MRAM device 100 explained with reference to FIG. 1 through FIG. 3, and those aspects are not repeated below. Referring to FIG. 4, the MRAM device 400 includes a bit line 402, which is electrically coupled to the magnetic tunnel junction 104 and is dedicated for applying a heating current during writing and applying a sense current during reading. In addition to the field line 110a, the MRAM device 400 includes another field line 404, which is disposed above the bit line 402 and is substantially orthogonal to the field line 110a. During a write operation, a write current can be applied through the field line 404 to induce a write magnetic field 406 to switch a storage magnetization direction accordingly. During a read operation, a read current can be applied through the field line 404 to induce a read magnetic field 408 to vary a sense magnetization direction accordingly. The field line 404 can be activated in combination with the field line 110a to induce a resultant magnetic field during writing and reading.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A memory device comprising:
at least one magnetic random access memory (MRAM) cell including
a sense layer;
a storage layer; and
a spacer layer disposed between the sense layer and the storage layer,
wherein, during a write operation, the storage layer has a magnetization direction that is switchable between m directions to store data corresponding to one of m logic states, with m>2,
wherein, during a read operation, the sense layer has a magnetization direction that is varied, relative to the magnetization direction of the storage layer, to determine the data stored by the storage layer, and
wherein the MRAM cell further includes a pinning layer adjacent to the storage layer, and the pinning layer is configured to stabilize the magnetization direction of the storage layer with respect to a threshold temperature.

2. The memory device of claim 1, wherein m=$2^n$, with n≧2, and the MRAM cell is an n-bit cell.

3. The memory device of claim 1, wherein the sense layer includes a soft ferromagnetic material, and the storage layer includes a hard ferromagnetic material.

4. The memory device of claim 3, wherein a coercivity of the soft ferromagnetic material is smaller than a coercivity of the hard ferromagnetic material.

5. The memory device of claim 1, further comprising a bit line electrically coupled to the MRAM cell, and wherein, during the write operation, the bit line is configured to apply a heating current to heat the MRAM cell above the threshold temperature to switch the magnetization direction of the storage layer.

6. The memory device of claim 1, further comprising a bit line electrically coupled to the MRAM cell, and wherein, during the read operation, the bit line is configured to apply a sense current to determine a resistance of the MRAM cell, and the resistance is indicative of a degree of alignment between the magnetization direction of the sense layer and the magnetization direction of the storage layer.

7. The memory device of claim 6, wherein, during the read operation, the magnetization direction of the sense layer is varied to determine a minimum of the resistance.

8. The memory device of claim 1, wherein, during the read operation, the magnetization direction of the sense layer is switched between at least a subset of the m directions.

9. The memory device of claim 1, further comprising a first field line and a second field line that are each magnetically coupled to the MRAM cell, and wherein, during the write operation, the first field line is configured to apply a first write current to induce a first write magnetic field, and the second field line is configured to apply a second write current to induce a second write magnetic field.

10. The memory device of claim 9, wherein, during the write operation, the magnetization direction of the storage layer is switched to a particular one of the m directions in accordance with at least one of the first write magnetic field and the second write magnetic field.

11. The memory device of claim 9, wherein, during the read operation, the first field line is configured to apply a first read current to induce a first read magnetic field, and the second field line is configured to apply a second read current to induce a second read magnetic field.

12. The memory device of claim 11, wherein, during the read operation, the magnetization direction of the sense layer is varied in accordance with at least one of the first read magnetic field and the second read magnetic field.

13. The memory device of claim 9, wherein the first field line and the second field line extend along directions that are substantially orthogonal with respect to one another.

14. A method of operating a magnetic random access memory (MRAM) cell, comprising:
during a write operation, switching a storage magnetization direction of the MRAM cell from an initial logic state to one of multiple other logic states to store a multi-bit data value;
during a read operation, varying a sense magnetization direction of the MRAM cell, relative to the storage magnetization direction, to determine the stored multi-bit data value;
during the read operation, determining a resistance value of the MRAM cell, with the resistance value being indicative of a degree of alignment between the sense magnetization direction and the storage magnetization direction, wherein during the read operation, the sense magnetization direction is varied to determine a minimum resistance value.

15. The method of claim 14, wherein, during the write operation, the storage magnetization direction is switched to a particular one of m logic states, with m>2.

16. The method of claim 15, wherein m=2$^n$, with n≧2, and the stored multi-bit data value is an n-bit data value.

17. A memory device comprising:
   at least one magnetic random access memory (MRAM) cell including
      a sense layer;
      a storage layer; and
      a spacer layer disposed between the sense layer and the storage layer; and
   a bit line electrically coupled to the MRAM cell;
   wherein:
      during a write operation, the storage layer has a magnetization direction that is switchable between m directions to store data corresponding to one of m logic states, with m >2;
      during a read operation, the sense layer has a magnetization direction that is varied, relative to the magnetization direction of the storage layer, to determine the data stored by the storage layer;
      during the read operation, the bit line is configured to apply a sense current to determine a resistance of the MRAM cell, and the resistance is indicative of a degree of alignment between the magnetization direction of the sense layer and the magnetization direction of the storage layer; and
      during the read operation, the magnetization direction of the sense layer is varied to determine a minimum of the resistance.

18. The memory device of claim 17, wherein, during the read operation, the magnetization direction of the sense layer is switched between at least a subset of the m directions.

19. The memory device of claim 17, further comprising a first field line and a second field line that are each magnetically coupled to the MRAM cell, and wherein:
   during the write operation, the first field line is configured to apply a first write current to induce a first write magnetic field, and the second field line is configured to apply a second write current to induce a second write magnetic field; and
   during the read operation, the first field line is configured to apply a first read current to induce a first read magnetic field, and the second field line is configured to apply a second read current to induce a second read magnetic field.

20. The memory device of claim 19, wherein the first field line and the second field line extend along directions that are substantially orthogonal with respect to one another.

* * * * *